US009678119B2

(12) United States Patent
King, Jr. et al.

(10) Patent No.: US 9,678,119 B2
(45) Date of Patent: Jun. 13, 2017

(54) SHOCK DETECTOR

(71) Applicants: L. Herbert King, Jr., Jupiter, FL (US); James Keeven, O'Fallon, MO (US); Justin McKinney, Wildwood, MO (US); Nathan C. Burns, Wildwood, MO (US); Frank Vlasaty, St. Louis, MO (US)

(72) Inventors: L. Herbert King, Jr., Jupiter, FL (US); James Keeven, O'Fallon, MO (US); Justin McKinney, Wildwood, MO (US); Nathan C. Burns, Wildwood, MO (US); Frank Vlasaty, St. Louis, MO (US)

(73) Assignee: SHOCK ALERT LLC, O'Fallon, MO (US)

( * ) Notice: Subject to any disclaimer, the term of this patent is extended or adjusted under 35 U.S.C. 154(b) by 0 days.

(21) Appl. No.: 14/998,497

(22) Filed: Jan. 12, 2016

(65) Prior Publication Data
US 2016/0154036 A1 Jun. 2, 2016

Related U.S. Application Data

(63) Continuation of application No. 13/987,731, filed on Aug. 26, 2013, now Pat. No. 9,285,396.
(Continued)

(51) Int. Cl.
G01R 19/00 (2006.01)
G01R 19/165 (2006.01)
(Continued)

(52) U.S. Cl.
CPC ......... G01R 19/1659 (2013.01); G01R 19/00 (2013.01); G01R 19/0084 (2013.01);
(Continued)

(58) Field of Classification Search
CPC  G01R 19/00; G01R 19/0084; G01R 19/0092; G01R 19/145; G01R 19/15;
(Continued)

(56) References Cited

U.S. PATENT DOCUMENTS 3,510,766 A  5/1970 Russel
3,662,260 A  5/1972 Thomas et al.
(Continued)

FOREIGN PATENT DOCUMENTS

CN  2125857 U  12/1992
EP  2189797  5/2010
(Continued)

OTHER PUBLICATIONS

Final Report October et al "USCG FY 2006 Grant In-Water Shock Hazard Mitigation Strategies Authored by (USN, RET)", Oct. 1, 2008, XP055266123, Retrieved from the Internet: URL:http://www.boatus.com/seaworthy/assets/pdf/in-water-shock-hazard-mitigation-strategies.pdf.
(Continued)

Primary Examiner — Hoai-An D Nguyen
(74) Attorney, Agent, or Firm — Jacobson & Johnson LLC

(57) ABSTRACT

A shock detector having an electrical detector having a set of water immersible electrodes for detecting hazardous water conditions through the determination of the presence of either an electrical current in a body of water, a voltage in the body of water or a voltage gradient in the body of water and then providing an alert to the existence of hazardous electrical conditions in the body of water which in some cases may transmitted to a power source to shut off a power source thereby removing the hazardous water condition.

9 Claims, 4 Drawing Sheets

Related U.S. Application Data

(60) Provisional application No. 61/743,184, filed on Aug. 28, 2012.

(51) Int. Cl.
  *G01R 19/155* (2006.01)
  *G01R 19/145* (2006.01)
  *G01R 27/22* (2006.01)
  *G01R 19/10* (2006.01)
  G01R 27/14 (2006.01)
  G01R 27/08 (2006.01)

(52) U.S. Cl.
  CPC ......... *G01R 19/0092* (2013.01); *G01R 19/10* (2013.01); *G01R 19/145* (2013.01); *G01R 19/155* (2013.01); *G01R 19/165* (2013.01); *G01R 27/22* (2013.01); G01R 27/08 (2013.01); G01R 27/14 (2013.01)

(58) Field of Classification Search
  CPC .... G01R 19/155; G01R 19/165; G01R 27/02; G01R 27/08; G01R 27/14; G01R 19/10; G01R 19/1659; G01R 27/22
  USPC ................. 324/600, 649, 691, 713
  See application file for complete search history.

(56) References Cited

U.S. PATENT DOCUMENTS

| | | | |
|---|---|---|---|
| 3,784,903 A | 1/1974 | Thomas | |
| 3,869,668 A | 3/1975 | Thompson | |
| 4,864,282 A | 9/1989 | Toeg | |
| 5,005,007 A | 4/1991 | Weng | |
| 5,146,208 A | 9/1992 | Parra | |
| 5,202,638 A | 4/1993 | Kolz | |
| 5,402,298 A * | 3/1995 | Gershen | H01H 83/02 307/326 |
| 8,686,713 B2 | 4/2014 | Cargill, III | |
| 9,285,396 B2 * | 3/2016 | King, Jr. | G01R 19/00 |
| 2008/0174441 A1 | 7/2008 | Durand | |
| 2011/0277488 A1 * | 11/2011 | Peretz | F24F 5/0071 62/79 |

FOREIGN PATENT DOCUMENTS

| | | | | |
|---|---|---|---|---|
| JP | H08201146 A | | 8/1996 | |
| JP | H11241919 A | | 9/1999 | |
| WO | WO 2010/078617 A1 | | 7/2010 | |
| WO | WO 2010078617 A1 * | | 7/2010 | ........... G08B 21/082 |

OTHER PUBLICATIONS http://www.kmbc.com/news/Inventor-s-device-warns-of-lake-electricity-risk/15598478.
http://www.komu.com/news/man-invents-dock-shock-alert-system-/#.UDQB7qEOxQE.facebook.
https://www.facebook.com/Dock-Shock-Alert-474581832560744/?hcref=PAGES TIMELINE.
U.S. Department of Agriculture. Effects of Electrical Voltage/Current on Farm Animals: How to Detect and Remedy Problems. Beltsville, MD: U.S. Department of Commerce, 1991.
Johnson, Donald. "The Case of Stray Voltage in a Lake." Electrical Construction and Maintenance (2009): pp. 1-5. Website.
http://www.docklifeguard.com.
https://www.facebook.com/474581832560744/videos/3810773824197/?comment    id=10206443732628449&commenttracking=%7B%22tn%22%3A%22R%22%7D.
www.midwestboatparty.com/forum/archive/index.php/t-32733.html.
www.youtube.com/watch?v=sDgRMAw2iBE.
http://www.kmbc.com/image/view/-/15599516/medRes/2/-/maxh/350/maxw/620/-/vnwhpm/-/Inventor-hopes-Dock-Shock-Alert-saves-lives.jpg.
https://youtu.be/shkhmZTTKdY.
https://www.facebook.com/Talkscheap?fref=ts.
https://facebook.com/Dock-Shock-Alert-474581832560744/.

* cited by examiner

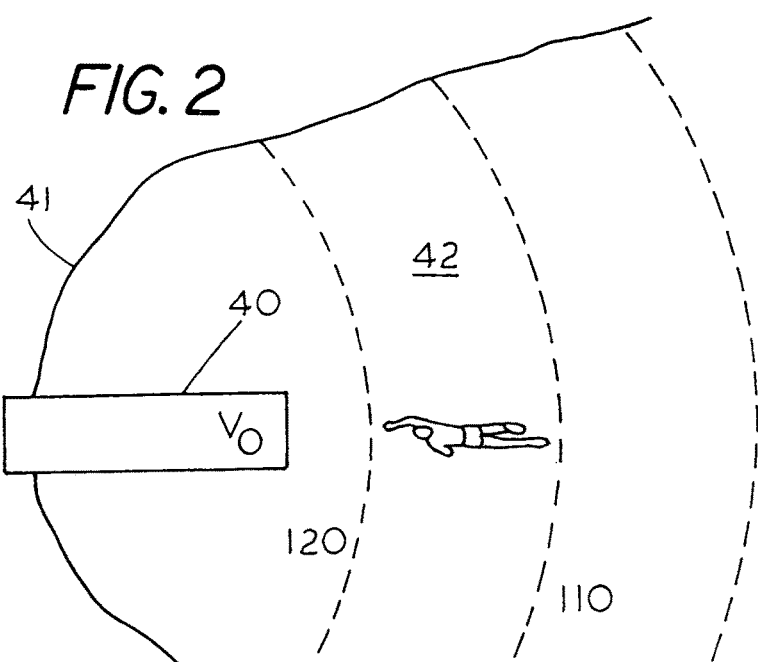
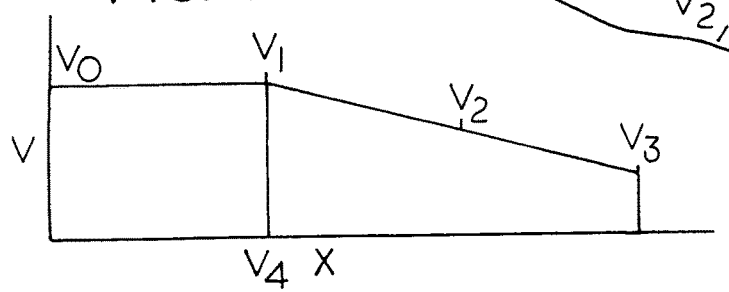
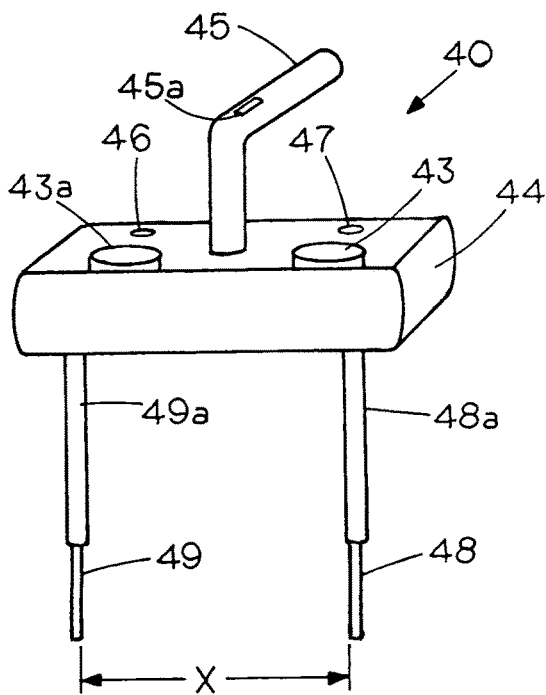

SHOCK DETECTOR

CROSS REFERENCE TO RELATED APPLICATIONS

This application is a continuation of application Ser. No. 13/987,731 filed Aug. 26, 2013 titled SHOCK DETECTOR (pending), which claims priority from provisional application 61/743,184 filed Aug. 28, 2012.

STATEMENT REGARDING FEDERALLY SPONSORED RESEARCH OR DEVELOPMENT

None

REFERENCE TO A MICROFICHE APPENDIX

None

BACKGROUND OF THE INVENTION

This invention relates generally to shock detectors and, more specifically, to shock detectors that can be used to prevent electric shock drowning by detecting the presence of current leakage into a body of fresh water and if the current leakage comprises a hazard to a swimmer or a person coming into contact with the body of water since the current leakage into a body of water creates an electric field in the body of water. Typically, the current leakage occurs from a faulty electrical connection on a boat or dock.

It is known that if a swimmer encounters a body of water with an electric field the swimmer can be electrocuted. The mere presence of the swimmer in the electric field causes the current flowing in the water to take a path of least electrical resistance through the swimmers body since the wet skin on a swimmer's body has a lower electrical resistance than the water surrounding the swimmer. If the voltage differential is sufficiently high the current flowing through the swimmer's body can electrocute the swimmer. In still other cases a nonswimmer may be electrocuted if he or she comes into incidental contact with a body of water, which has leakage from an electrical source.

SUMMARY OF THE INVENTION

A shock detector having a set of water immersible electrodes for detecting hazardous water conditions through the determination of the presence of either an electrical current in a body of water, a voltage in the body of water or a voltage gradient in the body of water. The shock detector alerts a person to the existence of hazardous electrical conditions in the body of water. In some cases the shock detector may signal a remote station to shut off a power source to the electrical circuit that may be the source that is leaking electrical energy into the body of water and thereby prevent injury or death to persons by alerting operators that the body of water is hazardous as it contains an electric field.

BRIEF DESCRIPTION OF THE DRAWINGS

FIG. 2 is a top view illustrating an electrical field surrounding a dock that is leaking current into the body of water around the dock;

FIG. 3 is a graph that generally illustrates the voltage in the water as a function of distance from a dock or the distance from a boat having an electrical short;

FIG. 4 is a perspective view of a shock detector having water electrodes extending therefrom;

DESCRIPTION OF THE PREFERRED EMBODIMENT

Figure 1:
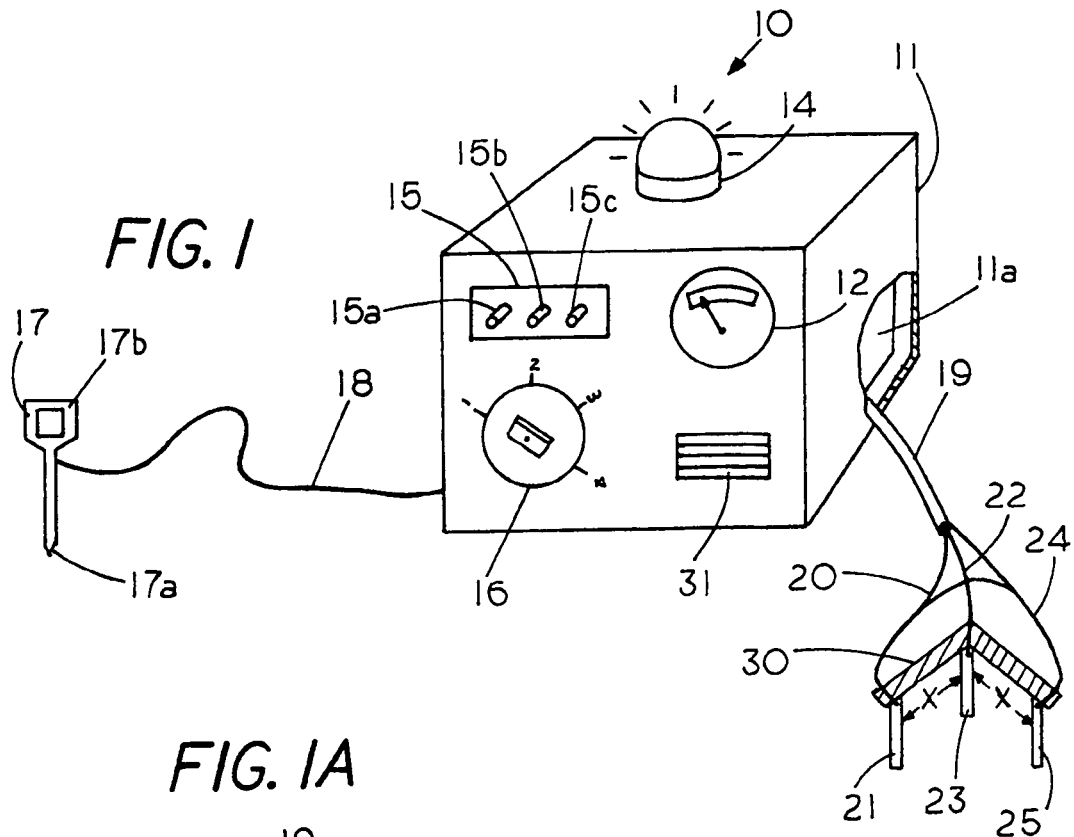
FIG. 1 is a perspective view of a portable electric shock detector for detecting water conditions that can produce electric shock.

FIG. 1 is a perspective view of a shock detector 10 comprising a housing 11 having a ground electrode 17 connected to shock detector 10 by an electrical conductor 18. In this example electrode 17 contains a conical point 17a for ease of insertion the electrode into the soil proximate a body of water, for example a freshwater lake or pond. A handle 17b enables one to quickly remove the electrode 17 from the ground or conversely the handle 17b may be used to force the electrode 17 into the ground proximate a dock or the like, which may have an electrical short therein. Housing 11 contains an electrical detector 11a such as a AC voltmeter or an AC ammeter or both although in some cases the electrical detector may comprises a DC voltmeter or a DC ammeter or both. In addition the electrical detector 11a may contain both AC and DC sensors so that one can sense the presence of hazardous conditions from either AC or DC voltage in the body of water. In either case the electrical detector 11a can sense the presence of a hazardous electrical condition through a set of water electrodes that can be brought into contact with a body of water through immersion of at least a portion of the water electrodes in the body of water. Both AC and DC voltmeters and ammeters are known in the art and are not described herein.

In the example shown in FIG. 1 shock detector 10 contains a circular hub 30 (shown partially in section) supporting a set of electrical probes or water electrodes, which extend therefrom. Hub 30 includes a first water electrode 21 that connects to electrical detector 11a through a flexible electrical insulated lead 20, a second water electrode 23 that connects to electrical detector 11a through a flexible electrical insulated lead 22 and a third water electrode 25 that connects to electrical detector 11a through a flexible electrical insulated lead 24 with all the leads located within an elongated flexible tubular support member 19 that has one end attached to the housing 11 and the other end attached to the hub 30. The tubular support member 19, which may be a few feet in length has sufficient tensile strength so it can be used to safely raise or lower the water electrodes 21, 23 and 25 into a body of water. For example, a person standing on a dock may lower the hub 30 and the water electrodes 21, 23, and 25 into the body of water from the safety of the dock allowing the person avoid direct contact with the body of water proximate the dock. Similarly, the flexible electrical lead 18 connecting the shock detector 10 to ground, which may be the soil around a lake or pond, may be a few feet in length as it enables a person to move the shock detector 10 to monitor electrical conditions at various locations without having to move the ground electrode 17. Typically, the electrical leads and the ground electrode have handling regions that are covered with an electrically insulating material so that the person setting up or using the shock detector is not accidental shocked or electrocuted.

The electrical conducting water electrodes 21, 23 and 25, which are immersible in a body of water such as a lake, pond or swimming pool, are supported on an electrically insulated hub 30 with each of the electrodes spaced a distance x from each other. In this example the distance x between each of the electrodes is equal, however, other spacing may be used without departing from the spirit and scope of the invention. By spacing the water electrodes 21, 23 and 25 at right angles to each other allows one to measure an electrical field in different directions and by knowing the distance one may use the information determine if a hazardous electrical field is present in the body of water as well as the intensity of the electrical field and in some cases insight into the source of current leakage.

When either a voltage or amperage measurement from the water electrodes exceeds a dangerous condition, i.e. a condition where the electric field is sufficiently intense so as to kill or injure a person, either an audio alarm 31 or a visual alarm 14, which may comprise a flashing light 14, alerts one that the body of water contains a hazardous electrical condition or electric field that can injure or electrocute a person who comes into contact with the body of water. The shock detector 10 in some cases may be permanently mounted to a dock or other object proximate the body of water to provide an ongoing warning of a hazardous electrical condition. As used herein the term electric field or electric water field occurs due to presence of an unwanted current flowing from a source of electrical power to an earth ground through the body of water rather than dissipation in an electrical device and return line. In general although electrical resistance of the water may be high the electrical resistance of a person in the body of water is less so that the current flowing through the body of water takes the path of least resistance, which is through the person rather than through the water proximate the person.

In the example shown in FIG. 1 the shock detector 10 includes a set of switches 15 that allow a person to select or deactivate various feature of the shock detector. For example switch 15a, turns on or off the visual alarm and switch 15b turn on or off the audible alarm 31 and switch 15c turns the shock detector on or off. In addition, a selector switch 16 allows one change the electrical detector 11a from a current detection mode to a voltage detection mode. In still other cases the selector switch 16 enables one to change the mode of operation of electrical detector 11a so one can measure if there is a voltage between the ground electrode and one or more of the water electrodes 21, 23 or 25 or conversely one may measure the current flowing between the ground electrode 17 and one or more of the water electrodes 21, 23 or 25 by simply immersing the water electrodes in the body of water. In other examples one may check metal objects extending into a body of water by contacting the metal object with the water electrodes, for example a metal ladder extending into the body of water. Thus the shock detector 10 is capable of determining if hazardous electrical conditions exist either in or out of the body of water.

The selector switch 16 permits the operator to select various water electrodes for measurement of voltage or current therebetween. For example, a first position for measuring the voltage between ground electrode 17 and water electrode 21. A second position for measuring the voltage between water electrode 21 and water electrode 23. A third position for measuring the voltage between water electrode 23 and water electrode 25 and a fourth position for simultaneously measuring the voltage between electrode 21 and 23 and electrode 23 and 25. In some cases a processor within the electrical detector 11a can be used to provide an indication of where the electrical hazard may originate from by showing the directional strength of the electric field. For example, using the ground and water electrodes to measure the voltage of electrical field at different locations one can obtain a gradient of volts per meter in different directions. Thus, in some instances the shock detector can be used as a tool for locating the source of the electrical hazard.

The portable hub 30, which is shown in FIG. 1, is suspended by an elongated flexible support member 19 that allows electrodes 21, 23 and 25 to be easily positioned at various water locations through hand manipulation of support member 19. The ease in positioning the hub and the electrodes in a body of water enables one to quickly check various regions around objects, such as a dock or a boat, for the existence of a hazardous electrical condition in the water proximate the objects. A further feature is that the electrical isolation of the shock detector and the hub ensures that the operator need not come into contact with an electrical water hazard while checking for the existence of the electrical water hazard.

Figure 1A:
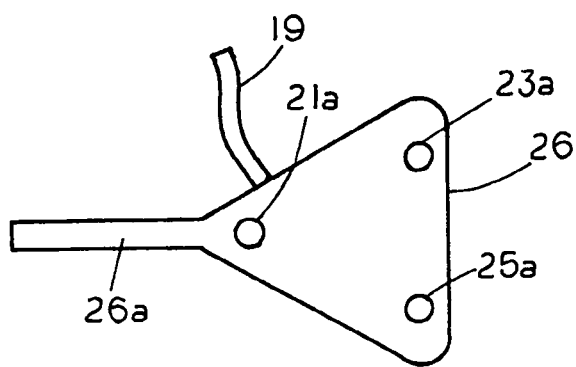
FIG. 1A is a bottom view of a probe for a hand held shock detector.
Figure 1B:
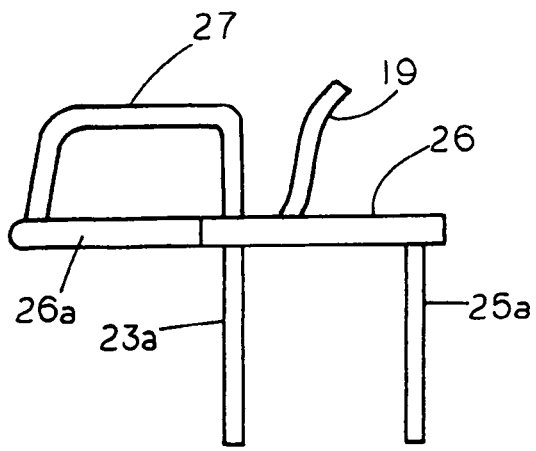
FIG. 1B is a side view of the probe of FIG. 1A.

FIG. 1A and FIG. 1B show an alternate embodiment, namely, a hand holdable hub 26, which connects to electrical detector 11a through flexible support member 19. FIG. 1A is a bottom view of hub 26 and FIG. 1B is a side view of hub 26. In this example the hub 26 includes a handle 27 that mounts to end 26a of hub 26. The handle 27 and the hub are electrically insulated to isolate the user from any electrical hazard while the electrical water electrodes 23a, 21a and 25a are immersed in a body of water or in contact with an object that may be an electrical hazard. Hub 26 with handle 27 allows the operator to quickly test for the existence an electrical hazard, which is not in the water, by extending one or more of the water electrodes into direct electrical contact with an object through manipulation of the electrically insulated handle 27.

Shock detector 10 may be permanently or temporarily installed on land as well as individual docks or commercial docks. When permanently mounted detector 10 can be set to deliver an ongoing visual signal that the water is safe and that no stray current exists proximate the dock. Alternative the shock detector 10 can be set in an active mode to deliver an audible alarm advising persons to stay away from the dock or the water proximate the dock when there is a hazardous electrical condition proximate the dock. As described herein a hazardous electrical condition is a condition where the strength of the electrical field is sufficient to deliver an electrical shock that can cause injure or death to a person.

Shock detector 10 may be permanently mounted to a dock to continually or intermittently monitor the water around the perimeter of the dock. In an alternate embodiment the shock detector may be portable to enable one to conduct on-the-go measurements of the voltage at various locations in the body of water.

In the event of a low water level, which may cause the electrodes of a permanently mounted shock detector 10 to come out of water the shock detector 10 may operate in a fail safe manner and alert persons proximate the dock that the water level is low and that the shock detector is no longer is accurately measuring the presence of a hazardous water condition. The operator can then reposition the water electrodes to bring the water electrodes into contact with the body of water. In an alternate embodiment the water electrodes may be mounted to a flotation device so that the water electrodes remain in the body of water as the water level rises or falls. Thus, in some cases one may moor a floating shock detector to an object or the lake bed to provide an ongoing indication of an electrical water hazard.

Shock detector 10 may include a rechargeable battery that lasts at least 48 hours so that the shock detector can continue to provide warnings in the event the electricity source powering shock detector 10 is interrupted. In other cases a solar panel may be attached to the shock detector to provide power to the shock detector. In addition to determining the existence of a hazardous electrical condition the shock detector 10 can include the capacity to monitor itself to determine if the performance of the shock detector is deteriorating. In response to a deterioration the shock detector may send a visible or audible signal or in the alternative the shock detector may send a signal to a smart phone or the like. This feature is useful where the shock detector is battery powered.

A further feature of shock detector 10 is the inclusion of a transmitter in the shock detector that communicates directly with a power company to alert the power company that one of their customers has a hazardous water condition. The transmitter may be incorporated directly to the electrical detector 11a.

A further feature of shock detector 10 is that one can detect current leakage when a boat, which is connected to shore power, has a faulty device that leaks current into the body of water around the boat. The placement of the electrodes in the body of water allow the shock detector 10 to provide an indication of the presence and strength of the electric field around the boat and the potential hazard to a person.

Shock detector 10 may also be used to measure offshore electrical water hazards. For example, a boat, which is off shore, may have an electrical fault, i.e. an electrical short that leaks current into the water around the boat thus creating a hazardous electric field around the boat. Consequently, a person diving or accidental contacting the water around the boat may be killed or severely injured if the electrical fault is sufficiently high that is creates an electric field that exceeds a dangerous threshold. The use of an onboard shock detector 10 allows one to monitor the electric field around the boat to ensure that there is no hazardous electrical condition proximate the boat.

To illustrate a condition that causes electric shock drowning a reference should be made to FIG. 2 which illustrates an electrical field in a body of water, which in this instance is a neutral to earth voltage. It should be understood that the term electric shock drowning as used herein refers to the existence of an electric field in a body of water with the electric field of sufficient strength that it creates a current flow through a person in the body of water with the current flow through the person sufficient to cause either paralysis or death. While no absolute threshold exists for every person and every water condition typically, a current flow as low as 10 milliamps through a person's body may be sufficient to result in electric shock drowning. As used herein the term dangerous threshold is the existence of an electric field where current flow through a person may be sufficiently low so that it paralyzes rather than electrocutes the person. However, if a person is in the water in a paralyzed condition the person may drown. Generally, death by drowning due to paralysis as well as death due to electrocution are often referred to as electric shock drowning as both are a result of the water having a current flow that can injure or kill a person.

Typically, the presence of the electric field, which is sometimes referred to as stray voltage, can be detected by shock detector 10. FIG. 2 which shows a top view of a dock 40 extending outward from shoreline 41 into a body of water 42 with the dock 40 having an electrical short that causes current to leak into the water which generates an electric field around the dock as the current leaks to the ground or lake bed. While the electric field surrounding the dock varies in size and shape, in general the closer to the dock, which has current leakage, the higher the voltage. In this example the dashed lines represents different voltage levels $V_1$, $V_2$ and $V_3$. With the voltage decreasing as the distance from the dock increases. Preferably, a shock detector should enable a user to detect current leakage proximate the dock as well as 100 feet or more from the dock or boat.

FIG. 3 is a graph indicating the voltage V level at a radial distance from the dock. In this example, the voltage at the dock 40 where the leak is incurring is $V_0$. The voltage in the water decreases from $V_0$ to $V_1$ and from $V_1$ to $V_2$ and from $V_2$ to $V_3$ with the decrease in voltage being a function of the distance from the dock. In the example shown a voltage gradient exists between various locations in the body of water, which typically may be expressed in volts per unit distance i.e. volts per meter.

FIG. 2 shows a swimmer 50 who is unknowingly swimming into the electrical field between the voltage levels $V_1$ and $V_2$. The swimmer 50 although not touching any object other than the water becomes a low resistance electrical conductor from one portion of the electric field (i.e. the 120 volt field $V_1$) to another portion of the electric field (i.e. the 110 volt field $V_2$) which causes the current to flow through the persons body rather than through the water proximate the person since the electrical resistance of the swimmers body is less than the water resistance between the two positions. The actual voltage in the water as well as the voltage patterns may vary but it is known that current, which is as low as 10 to 50 milliamps, may cause paralysis or death. As a consequence a person swimming in a body of water can be unexpectedly shocked or electrocuted without any contact with an electrical ground. In other instance a person stepping into the body of water from shore may be electrocuted. In each case the shock detector 10 could alert a person to keep a safe distance from the water by providing a warning that the water contains a hazardous electrical condition that can cause electric shock drowning.

Figure 5:
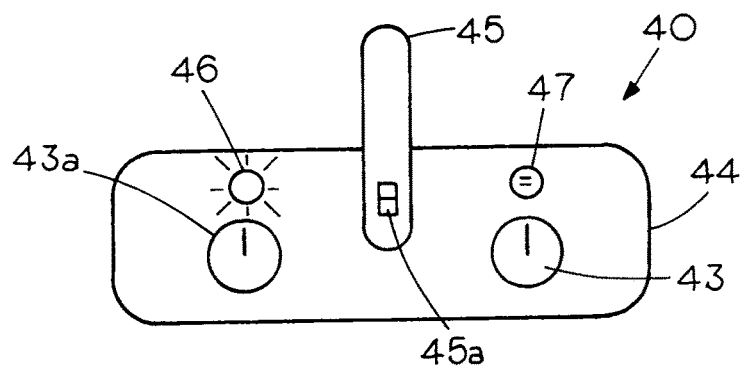
FIG. 5 is a top view of the shock detector of FIG. 4.

FIG. 4 shows a perspective view of an example of a hand held shock detector 40 and FIG. 5 shows a top view of the hand held shock detector 40. The hand held shock detector includes an electrically insulated housing 44 with an electrically insulated handle 45 and an on-off switch 45a located on handle 45. Extending downward from the bottom of housing 44 is a first water electrode 49 that is partially covered by an electrically insulated covering 49a and a second water electrode 48 that is partially covered by an electrically insulated covering 48a. In this example the hand held shock detector 40 is battery powered and includes two water electrodes 48 and 49 for measuring the voltage gradient between the electrodes when the operators lowers the electrodes into a body of water. In some cases the portable shock detector may contain a ground reference electrode that can be attached to the earth, however, in other cases the voltage may be determined without the use of a separate ground. In some cases the ground may be the bottom of the lake or pond, in such cases the one would connect an electrical ground wire from the shock detector to an electrical conducting ground anchor, which could be ground electrode 17. With a ground anchor one allows the anchor to sink to the bottom of the lake to form a ground electrode at the bottom of the lake or pond. Typically, an electrically insulating lead is secured to the anchor so that only the electrically conductive anchor contacts the bottom of the lake or pond and the electrical wire extending from the anchor to the shock detector is electrically isolated from a person proximate the shock detector.

The hand held shock detector 40 may include a visual alert such as a LED 46, an audible alarm 47 and indicators 43 and 43*a* that may provide either analog or digital measurements, which are indications of an electrical water hazard that may cause electro shock drowning. In the example of FIG. 4 and FIG. 5, the shock detector 43 may measure a voltage differential between the two water electrodes 48 and 49, which is an indication of a hazardous electrical condition in the body of water. In order to minimize any potential harm to a person testing the water the external portions of the housing 44, the handle 45 and substantially all of the water electrodes 48 and 49 are covered with an electrical insulating material. As FIG. 4 shows the electrodes are separated by a distance x which allows one to simultaneously measure voltage at different locations.

Figure 6:
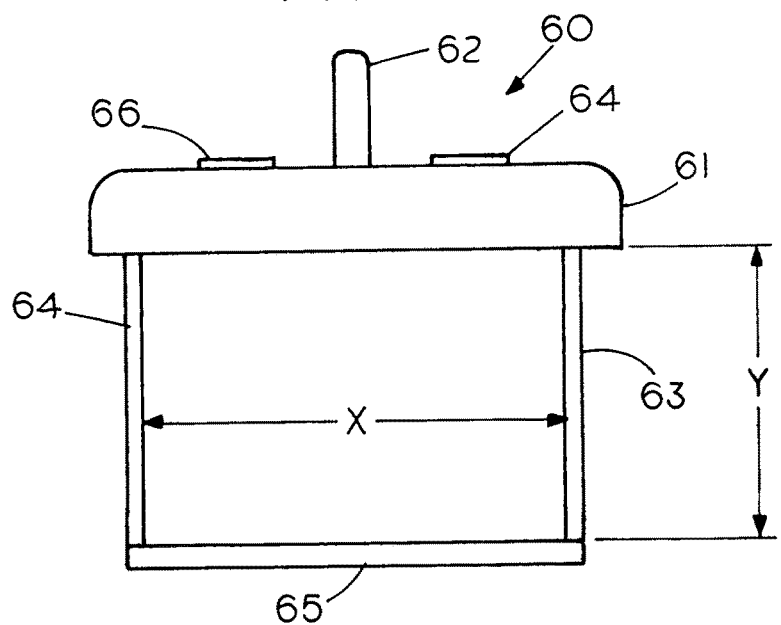
FIG. 6 is a front view of an alternate embodiment of a shock detector.

FIG. 6 shows another example of a hand held shock detector 60. In this example a housing 61 contains an electrical detector (either AC or DC) therein and a first member 64 and a second member 63 which extend from the bottom of housing 61. Located on top of housing 61 is a handle 62 and indicators 66 and 64. In this example an electrical conductor or current 65 extends from member 63 to member 64. The purpose of electrical conductor or current rod 65 is to simulate the electrical effects a swimmer may encounter when swimming in a body of water. That is, it is known that the current passes through the swimmers body as the electrical resistance of a persons body is less than the electrical resistance of the water. In the present example an electrical conductor or current rod 65 is placed in the body of water to simulate a swimmer. The current passing through the electrical conduct 65 is measured by an electrical detector 11*a* in housing 61, in this case an AC ammeter. Thus the existence of a current flowing through the current rod 65 as a result of the electric field activates the shock detector 60 to alert a person to the existence of a hazardous electrical condition in the water. An advantage of a current electrode is that a ground reference is unnecessary since the existence of current flow is dependent on a voltage difference between the two ends of the current electrode.

Figure 6A:
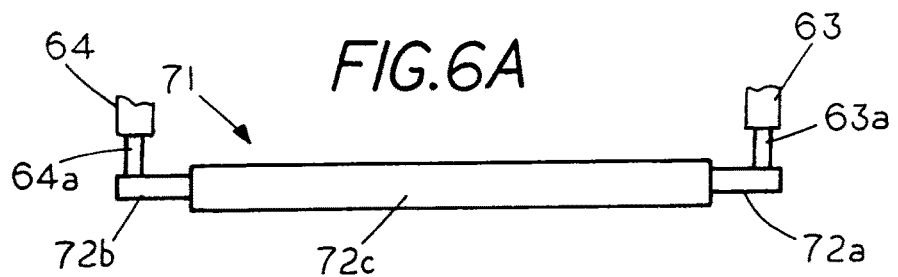
FIG. 6A is an isolated view of a current rod or current water electrode mountable to the shock detector of FIG. 6.

FIG. 6A shows an alternate embodiment of the electrical conductor 71, which is attached to member s 64*a* and 63*a*. In this example a portion of the electrical conductor 71 is covered with an electrical insulating material 72*c* leaving only the end 72*b* connected to electrode 64*a* and end 72*a* connected to electrode 63*a* to come into contact with the body of water.

Figure 7:
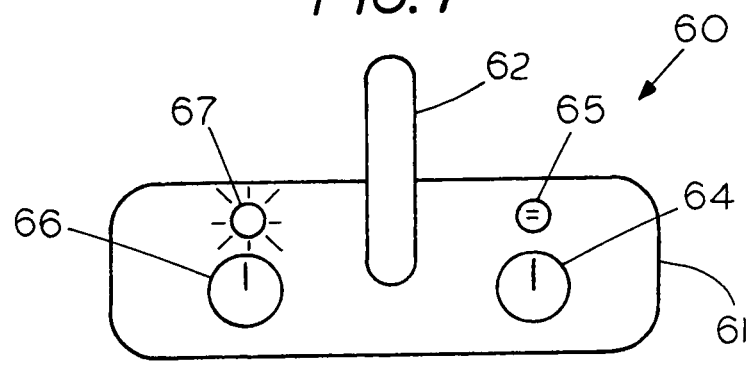
FIG. 7 is a top view of the shock detector of FIG. 6.

FIG. 7 shows a top view of the shock detector 60 revealing the operator alert indicators 64 and 66 as well as the visual alert 67, which may be an LED as well as an audible alarm 65. While shock detector 60 is shown as a hand held shock detector the shock detector 60 may be supported on a flotation material so that the shock detector housing floats on top of the body of water. In such a case the shock detector may be tethered to or a dock or anchored to the lake bottom. While the shock detector is useful for detecting a hazardous electrical condition in a lake or pond it also is useful to detect hazardous electrical conditions in an artificial body of water such as a swimming pool or the like.

Figure 8:
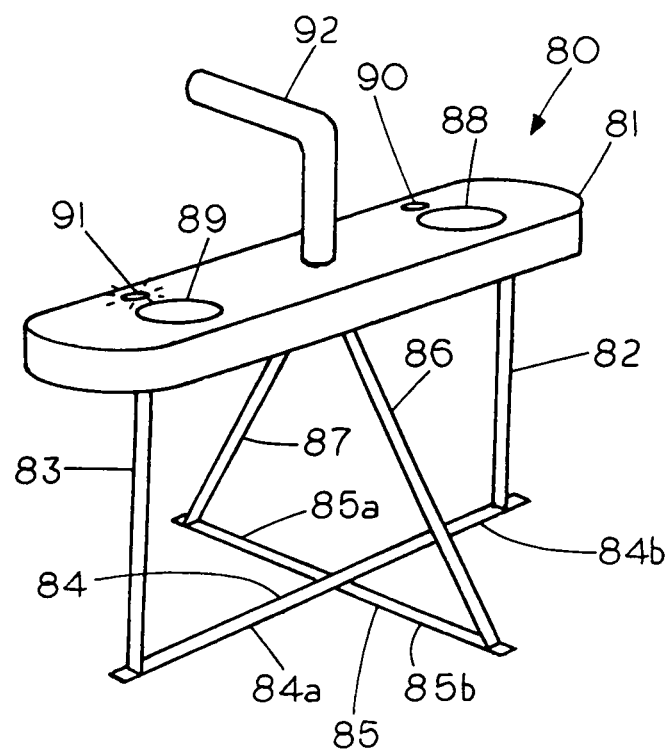
FIG. 8 is a perspective view of a shock detector having a set of current rods located at a right angle to each other.

FIG. 8 shows an alternate embodiment of a hand held battery operated current detector 80 that includes a handle 92 connected to housing 81. A set of indicators 88, 89, 90 and 91 are located on the top side of housing 71 to provide information regarding the presence of an electrical hazard in a body of water. The shock detector 80 differs from the shock detector of FIG. 6 in that two current electrodes 84 and 85 are located at a right angle to each other. In this case the electrodes 85 and 85 are electrically isolated from each other but are both sensitive to any current that flows through each of the electrodes. That is, current may flow from electrode 84*b* to 84*a* or vice versa with the current measurable through electrical members 82 and 83 and from electrode 85*b* to 85*a* or vice versa with the current measurable through electrical members 86 and 87. The measured currents can then be displayed on the indicators to provide an operator with information on the existence and strength of an electric field in a body of water. The use of orthogonal or traverse extending conductors may be used to provide further information on the origin of hazardous contained in the body of water.

We claim:

1. The method of determining if a body of water contains an electrical current that can injure or kill a person who enters the body of water comprising:
    placing a portable shock detector in the body of water to measure a voltage at various locations in the body of water;
    bringing a pair of water electrodes on the shock detector into contact with the body of water;
    measuring a voltage gradient between the pair of water electrodes while the shock detector is in the body of water;
    determining if the voltage gradient between the pair of water electrodes on the shock detectors exceeds a threshold level sufficient to injure or kill a person; and
    activating an alarm to alert a person that the voltage gradient exceeded the dangerous threshold that can injure or kill a person who enters the water.

2. The method of claim 1 including the step of:
    determining the location of an electrical short in the body of water by measuring the strength of the electric field at the various locations in the body of water.

3. The method of claim 1 including the step of measuring the voltage when the shock detector is floating in the body of water.

4. The method of claim 1 including the step of alerting a power company that a customer has current leakage into the body of water.

5. The method of claim 1 including the step sending an alert signal to a smartphone.

6. The method of claim 1 including the step of sending an alarm signal in response to a deterioration of shock detector performance.

7. The method of determining if a body of water contains an electrical threshold voltage comprising:
    placing a portable shock detector in the body of water to measure a voltage in the body of water;
    bringing a water electrode on the shock detector into contact with the body of water;
    measuring the voltage in the body of water while the shock detector is in the body of water;
    determining if the measured voltage on the shock detector exceeds a threshold voltage; and activating an alarm to alert a person that the threshold voltage has been exceeded.

8. The method of claim 7 including the step of activating a visible alarm to alert a person the measured voltage on the shock detector exceeds the threshold voltage.

9. The method of claim 7 including the step of activating an audible alarm to alert a person the measured voltage on the shock detector exceeds the threshold voltage.

\* \* \* \* \*